(12) United States Patent
Kim

(10) Patent No.: US 8,372,749 B2
(45) Date of Patent: *Feb. 12, 2013

(54) PRINTING PLATE AND METHOD FOR FABRICATING THE SAME

(75) Inventor: Chul Ho Kim, Incheon (KR)

(73) Assignee: LG Display Co., Ltd., Seoul (KR)

( * ) Notice: Subject to any disclaimer, the term of this patent is extended or adjusted under 35 U.S.C. 154(b) by 37 days.

This patent is subject to a terminal disclaimer.

(21) Appl. No.: 13/044,216

(22) Filed: Mar. 9, 2011

(65) Prior Publication Data

US 2011/0159689 A1    Jun. 30, 2011

Related U.S. Application Data

(62) Division of application No. 11/274,878, filed on Nov. 2, 2005, now Pat. No. 7,914,691.

(30) Foreign Application Priority Data

Nov. 4, 2004    (KR) .............. 10-2004-89311

(51) Int. Cl.
*H01L 21/44* (2006.01)
*H01L 21/28* (2006.01)

(52) U.S. Cl. ............... 438/674; 216/41; 257/E21.158

(58) Field of Classification Search ............... 216/41; 430/312; 438/674; 257/E21.158
See application file for complete search history.

(56) References Cited

U.S. PATENT DOCUMENTS

| | | | |
|---|---|---|---|
| 4,448,485 A | 5/1984 | Bergman et al. | |
| 4,895,790 A | 1/1990 | Swanson et al. | |
| 5,246,531 A | 9/1993 | Junji et al. | |
| 6,432,481 B1 | 8/2002 | Shinozaki | |
| 6,869,750 B2 * | 3/2005 | Zhang et al. | 430/312 |
| 7,914,691 B2 * | 3/2011 | Kim | 216/41 |
| 2002/0042024 A1 | 4/2002 | Tanaka et al. | |
| 2003/0011315 A1 | 1/2003 | Ito et al. | |
| 2003/0122896 A1 | 7/2003 | Jeong et al. | |
| 2004/0125330 A1 * | 7/2004 | Baek et al. | 349/187 |
| 2004/0247692 A1 | 12/2004 | Chen | |
| 2005/0018124 A1 | 1/2005 | Liao et al. | |

FOREIGN PATENT DOCUMENTS

| | | |
|---|---|---|
| EP | 0 402 942 A2 | 12/1990 |
| JP | 7-43885 | 2/1995 |
| JP | 07-319152 | 12/1995 |
| JP | 2000-238447 | 9/2000 |
| KR | 0153260 | 11/1998 |

OTHER PUBLICATIONS

First Office Action issued in corresponding Chinese Patent Application No. 200510109143.7; dated Oct. 19, 2007.
Search Report dated Apr. 26, 2006 for corresponding Korean Patent Application No. 10-2004-0089311.
Search Report issued in corresponding French Application No. 0511237; issued May 31, 2010.

* cited by examiner

*Primary Examiner* — Nadine Norton
*Assistant Examiner* — Mahmoud Dahimene
(74) *Attorney, Agent, or Firm* — Brinks Hofer Gilson & Lione (57) ABSTRACT

A printing plate and method for fabricating the same is disclosed. A metal layer is first formed on a glass substrate. The metal layer is then patterned in a predetermined shape. The glass substrate is next etched to a predetermined depth using the patterned metal layer as a mask and the metal layer removed. If necessary, additional metal layers have the same or different patterns may be formed on the glass substrate and the glass substrate etched after each metal layer is formed thereon until a desired etching depth in the glass is achieved.

8 Claims, 7 Drawing Sheets

PRINTING PLATE AND METHOD FOR FABRICATING THE SAME

The present patent document is a divisional of U.S. patent application Ser. No. 11/274,878, filed Nov. 2, 2005, which claims priority to Korean Patent Application No. P2004-89311, filed on Nov. 4, 2004, which is hereby incorporated by reference as if fully set forth herein.

TECHNICAL FIELD OF THE INVENTION

The present invention relates to a printing method for forming a pattern, and more particularly, to a printing plate and a method for fabricating the same, to print a printing material of the predetermined pattern on a printing roll.

BACKGROUND

Generally, an LCD device and a semiconductor device are formed with repeated steps of depositing a plurality of layers and etching the coated layers. To deposit each of the layers, a deposition process such as CVD (Chemical Vapor Deposition) and sputtering is performed. Photolithography is also performed to etch the coated layers.

If the deposition and etching processes are complicated due to the formation of the plurality of layers, the productivity is lowered. Thus, it is desirable to provide simplified deposition and etching processes for mass production.

In comparison with forming the desired pattern by coating the plurality of layers using CVD and sputtering and patterning the coated layers using photolithography, forming the desired pattern by printing is simpler and easier.

In the process of forming the desired pattern by printing, after the predetermined material is printed on a printing roll from a printing plate, the printed material of the printing roll is re-printed on a surface of a substrate by rolling the printing roll on the substrate, thereby forming the desired pattern on the substrate. In this case, physical contact is generated between the substrate and the printing roll, causing various problems with the substrate and the printing roll. However, as the printing method is advantageous for mass production, it has been developed with the various modifications.

Hereinafter, a printing method and a printing plate according to the related art will described with reference to the accompanying drawings.

FIGS. 1A to 1D are cross sectional views of the printing method according to the related art.

Figure 1A:
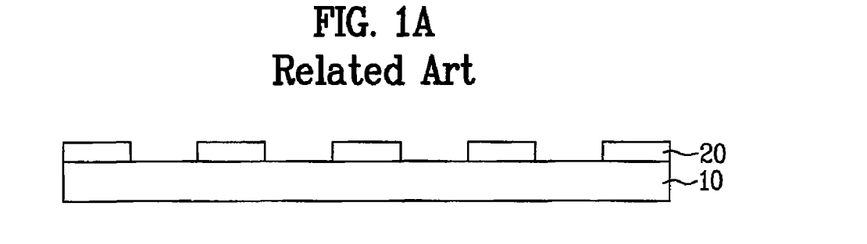
FIGS. 1A to 1D are cross sectional views of the process for a printing method according to the related art.

As shown in FIG. 1A, a printing plate is prepared having an organic material 20 patterned in the predetermined shape on a glass substrate 10.

Figure 1B:
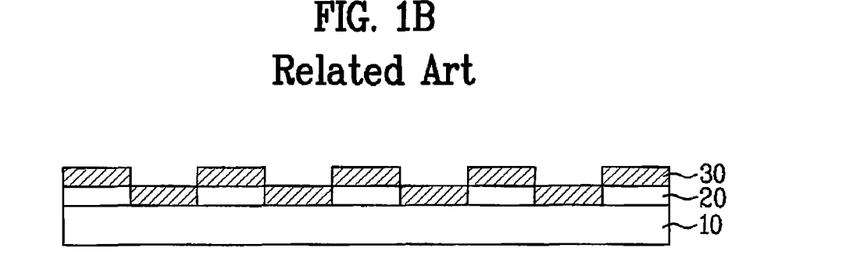

Referring to FIG. 1B, a printing material 30 is coated on the printing plate.

Figure 1C:
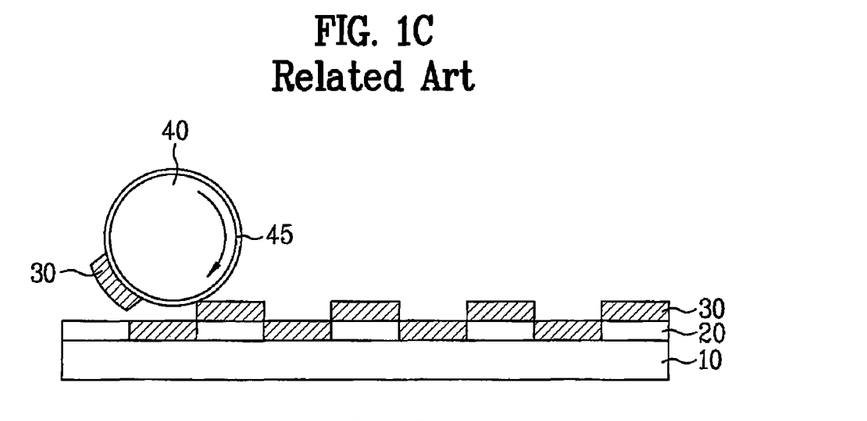

As shown in FIG. 1C, a printing roller 40 having a coating 45 adhered thereto rolls on the printing plate, whereby the printing material 30 is printed on the coating 45.

Figure 1D:
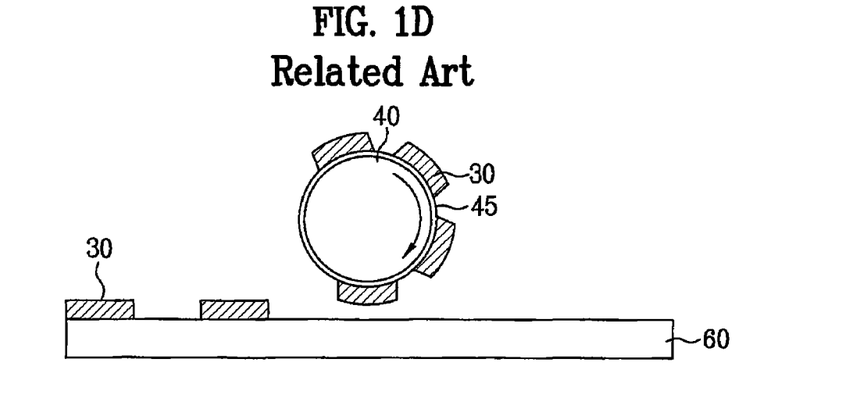

As shown in FIG. 1D, the printing roller 40 having the printing material 30 rolls on a substrate 60. Thus, the printing material 30 is printed on the substrate 60, whereby the printing material 30 of the predetermined pattern is formed on the substrate 60.

At this time, a printing plate on which the organic material 20 of the predetermined pattern is formed on the glass substrate 10 will be described in detail.

FIGS. 2A to 2E are cross sectional views of the process for fabricating the printing plate according to the related art.

Figure 2A:
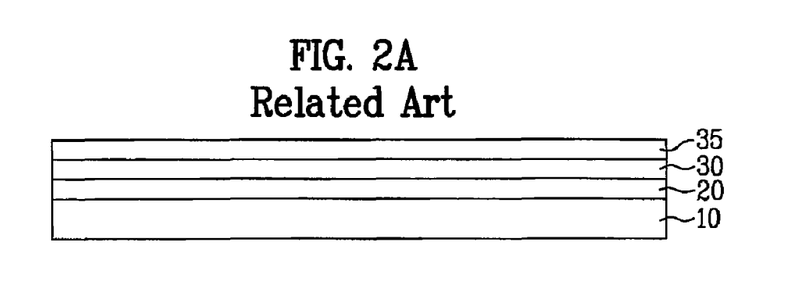
FIGS. 2A to 2E are cross sectional views of the process for fabricating a printing plate according to the related art.

First, as shown in FIG. 2A, the organic material 20, a metal layer 25 and a photoresist 35 are sequentially coated on the entire surface of the glass substrate 10.

Figure 2B:
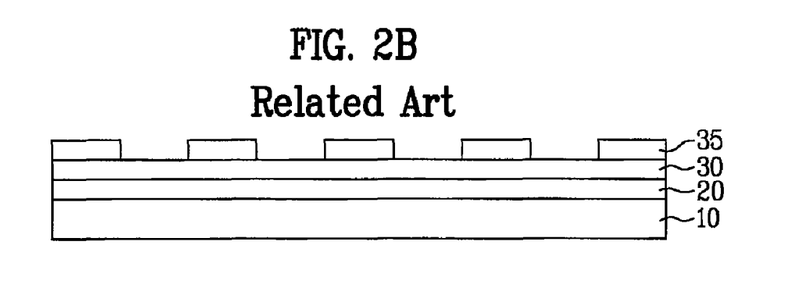

Referring to FIG. 2B, the photoresist 35 is patterned in the predetermined shape by photolithography.

Figure 2C:
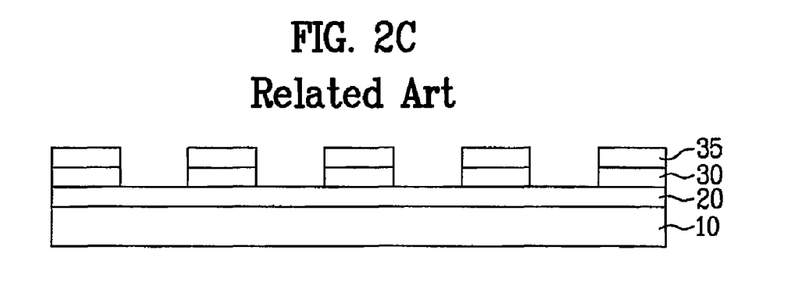

As shown in FIG. 2C, the metal layer 25 is etched using the patterned photoresist 35 as a mask.

Figure 2D:
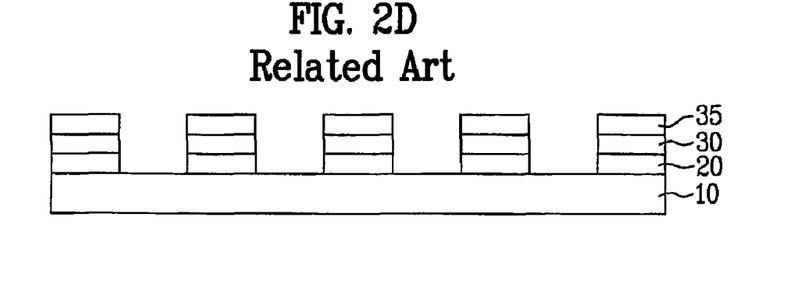

As shown in FIG. 2D, the organic material 20 is etched using the patterned photoresist 35 and metal layer 25 as a mask.

Figure 2E:
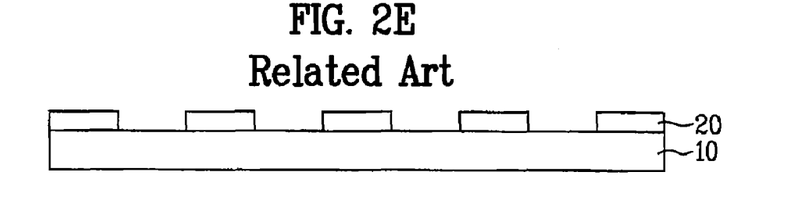

After that, as shown in FIG. 2E, the organic material 20 is formed in the predetermined pattern on the glass substrate 10 by removing the patterned photoresist 35 and metal layer 25, thereby completing the printing plate.

In the related art printing plate, the organic material 20 is formed in the predetermined pattern on the glass substrate 10.

However, the printing method and the printing plate according to the related art have the following disadvantages.

First, as shown in FIG. 1C, the printing roller 40 having the coating 45 adhered thereto rolls on the printing plate, so the printing material 30 coated on the printing plate is printed on the coating 45. In this case, the coating 45 is also generally formed of an organic material. Accordingly, the printing material 30 is printed between the organic materials. However, the printing material 30 may not be completely printed on the coating 45 from the organic material 20 of the printing plate. Thus, it may not be possible to form a minute pattern.

As shown in FIG. 2D, when etching the organic material 20 using the patterned photoresist 35 and metal layer 25 as a mask, end portions of the organic material 20 may not be etched in the desired pattern, so it may again not be possible to form a minute pattern sufficient to be used in semiconductor and/or LCD fabrication.

SUMMARY

By way of introduction only, a printing plate includes a glass substrate and a plurality of grooves in the glass substrate forming a surface with a predetermined shape. A portion of the surface in which the grooves are not formed have dimensions sufficient to accept a printing material capable of being used in fabrication of at least one of a semiconductor device or an LCD device.

In another aspect, a method for fabricating a printing plate includes forming a metal layer on a glass substrate; patterning the metal layer in a predetermined shape; and etching the glass substrate to a predetermined depth using the patterned metal layer as a mask.

In the printing method according to the present invention, instead of using the organic material for formation of the pattern, patterning the pattern uses the glass substrate itself, so that it is possible to form a minute pattern.

To pattern the glass substrate, the glass substrate is etched using the patterned metal layer as a mask. The etching method is a dry-etching method and/or a wet-etching method.

Using a wet-etching method, the glass substrate is etched in both horizontal and vertical directions. Accordingly, even though the glass substrate is etched using the metal layer as a mask, it is difficult at best to form a minute pattern. Using a dry-etching method, the glass substrate is not etched in the horizontal direction. Thus, if the glass substrate is etched using the metal layer as a mask by the dry-etching method, it is easier to form a minute pattern. In this respect, it is preferable to etch the glass substrate using the dry-etching method.

Using the dry-etching method, the metal layer as well as the glass substrate is etched. However, the etching rate of the metal layer is smaller than the etching rate of the glass substrate. Thus, the glass substrate is etched to a greater depth than the metal layer when etching both simultaneously.

Accordingly, in due consideration of the thickness of the metal layer and the etching depth of the glass substrate, etching the glass substrate using the metal layer as a mask may be performed repetitively, thereby etching the glass substrate to the desirable depth.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a printing method and a printing plate according to the present invention will be described with reference to the accompanying drawings.

FIGS. 3A to 3H are cross sectional views of the process for fabricating a printing plate according to one embodiment of the present invention. FIGS. 4A to 4D are cross sectional views of the process for forming a pattern of a metal layer on a glass substrate according to one embodiment of the present invention.

Figure 3A:
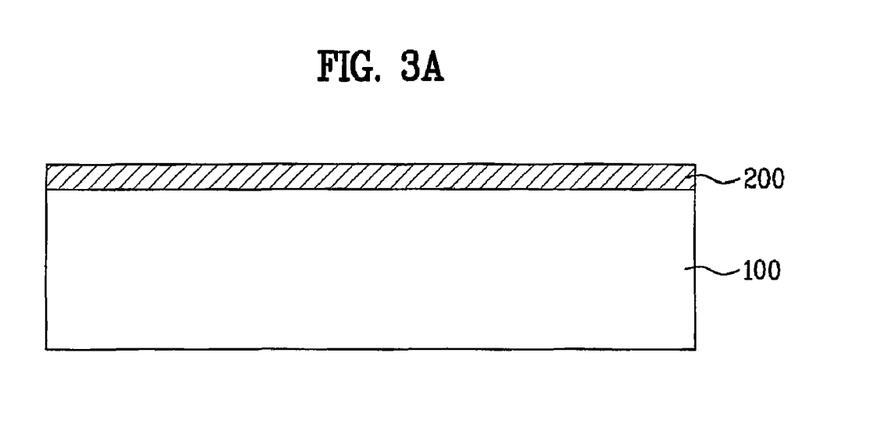
FIGS. 3A to 3H are cross sectional views of the process for fabricating a printing plate according to the preferred embodiment of the present invention.

As shown in FIG. 3A, a first metal layer 200 is formed on an entire surface of a glass substrate 100 having first portions (to be etched) 102 and second portions (not to be etched) 104.

Figure 3B:
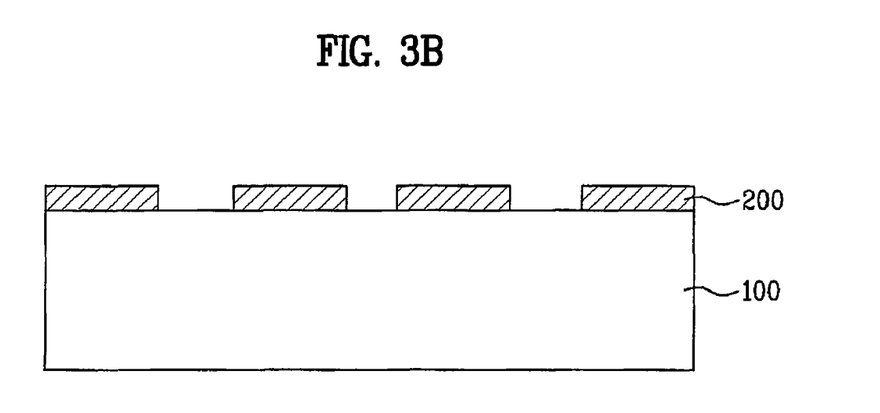

Referring to FIG. 3B, the first metal layer 200 is patterned in the predetermined shape such that the first metal layer 200 remains on the second portions 104 of the substrate 200.

The preferable method for patterning the first metal layer 200 will be described with reference to FIGS. 4A to 4D.

Figure 4A:
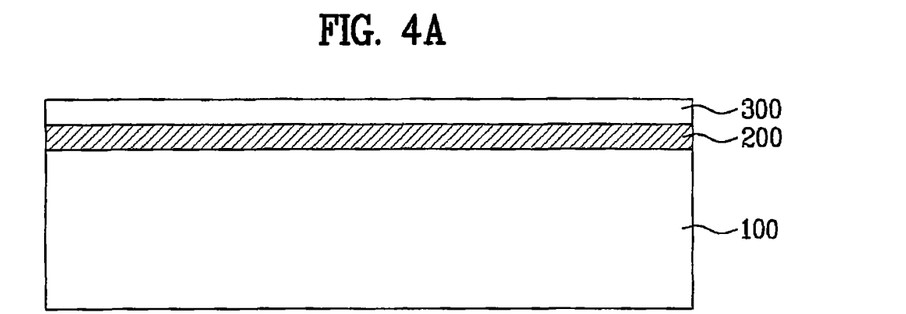
FIGS. 4A to 4D are cross sectional views of the process for forming a pattern of a metal layer on a glass substrate according to the preferred embodiment of the present invention.

First, as shown in FIG. 4A, a photoresist 300 is formed on the metal layer 200 of the glass substrate 100.

Figure 4B:
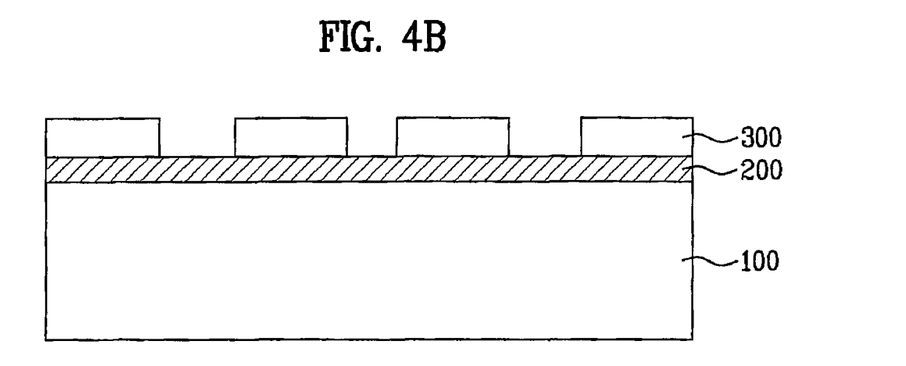

As shown in FIG. 4B, the photoresist 300 is patterned in the predetermined shape by photolithography, which uses light irradiation and development.

Figure 4C:
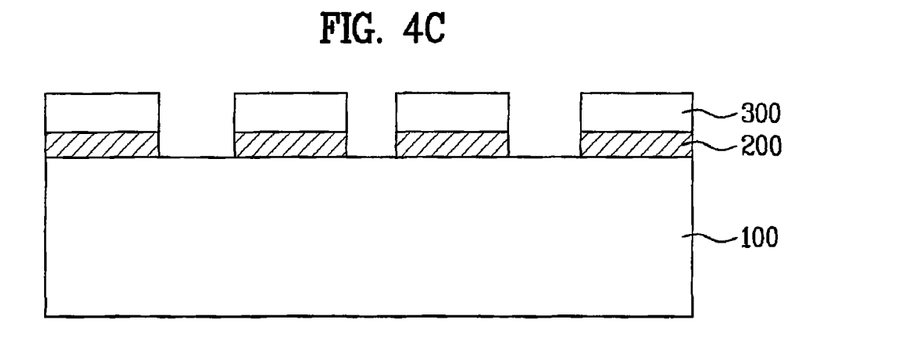

As shown in FIG. 4C, the metal layer 200 is next etched using the patterned photoresist 300 as a mask. The metal layer 200 is etched using dry-etching or wet-etching.

Figure 4D:
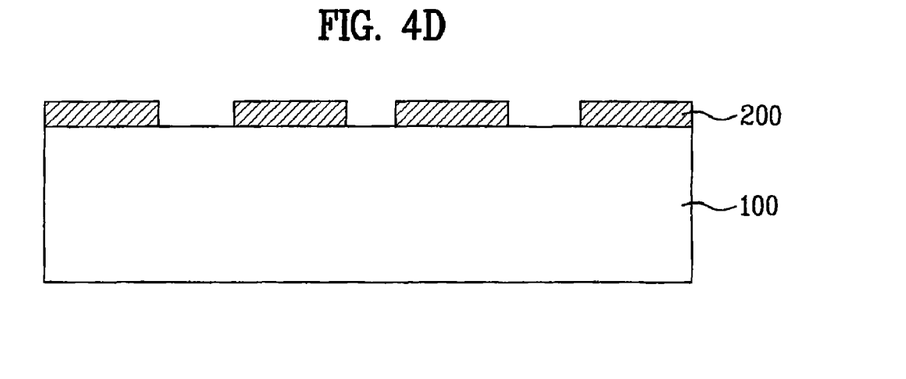

As shown in FIG. 4D, the patterned photoresist 300 is then removed.

The metal layer 200 is patterned on the glass substrate 100 according to the process of FIGS. 4A to 4D.

Figure 3C:
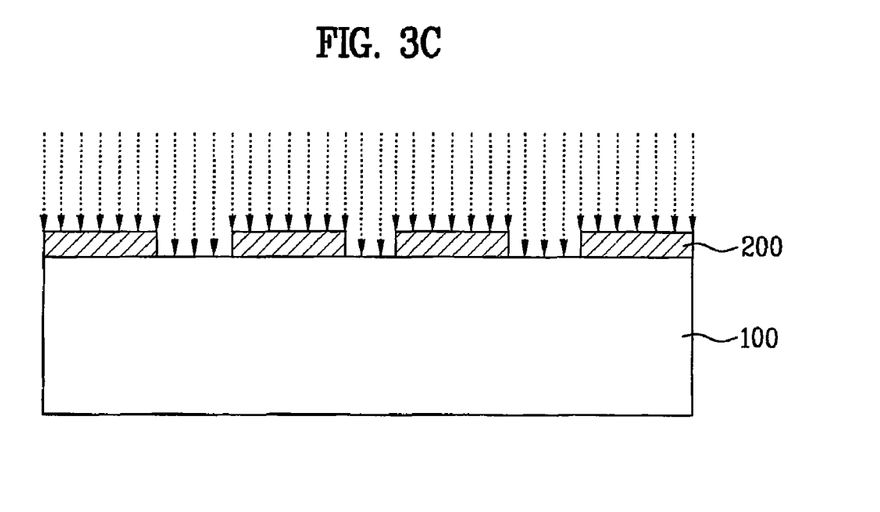

After that, as shown in FIG. 3C, the glass substrate 100 is etched to a predetermined depth using the patterned metal layer 200 as a mask. As shown, the glass substrate 100 is dry-etched.

Figure 3D:
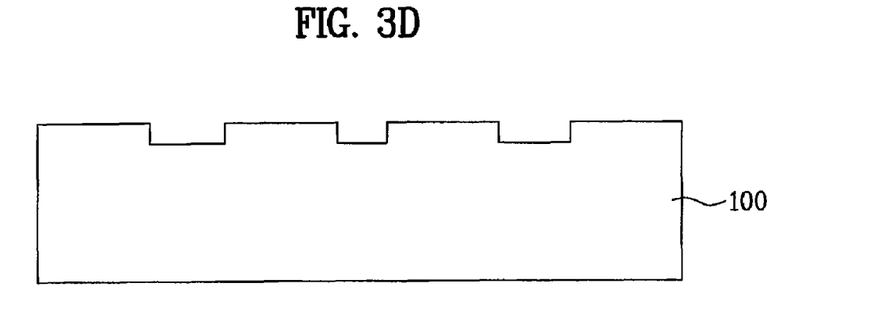

As shown in FIG. 3D, the patterned first metal layer 200 is then removed, thereby fabricating the printing plate having the glass substrate 100 of the first pattern.

At this time, the etching depth of the glass substrate 100 depends on the thickness of the first metal layer 200. In more detail, when the glass substrate 100 is etched, the first metal layer 200 is also etched. However, the etching ratio to the first metal layer 200 is lower than the etching ratio to the glass substrate 100. For example, when dry etching, the etching rate of the metal layer 200 is about 200 Å/minute, and the etching rate of the glass substrate 100 is about 800 Å/minute to 2000 Å/minute. Thus, the etching ratio of the metal layer 200 to the glass substrate 100 is about 1:4 to about 1:10.

Thus, so long as the glass substrate 100 is etched below a predetermined amount or etching occurs for less than a predetermined time, the etching process will be completed before completely etching the first metal layer 200. For example, if the etching rate of the first metal layer 200 is about 200 Å/minute, the etching rate of the glass substrate 100 is about 2000 Å/minute, the first metal layer 200 is 2000 Å thick, and etching may be performed for a maximum of 10 minutes, and thus the etching depth of the glass substrate 100 is about 20,000 Å (2 μm) at maximum. Accordingly, if the desired depth for etching the glass substrate 100 is below 2 μm, it is possible to form the printing plate with one process of FIGS. 3A to 3D. However, if the desired depth for etching the glass substrate 100 is above 2 μm, it is necessary to repeat the aforementioned process several times if it is not desirable to increase the thickness of the metal layer 200.

Alternately, if the thickness of the metal layer 200 is increased, then the etching depth of the glass substrate 100 may also be increased without increasing the number of process steps. However, it may be difficult to pattern a thick metal layer 200. Accordingly, there may be a limit to the amount by which the thickness of the first metal layer 200 may be increased. This correspondingly limits the increase of etching depth of the glass substrate 100.

As previously indicated, if the desired etching depth of the glass substrate 100 having the first pattern in FIG. 3D is not obtained, and the thickness of the metal layer 200 cannot be increased, additional repetitive processes are performed as follows.

Figure 3E:
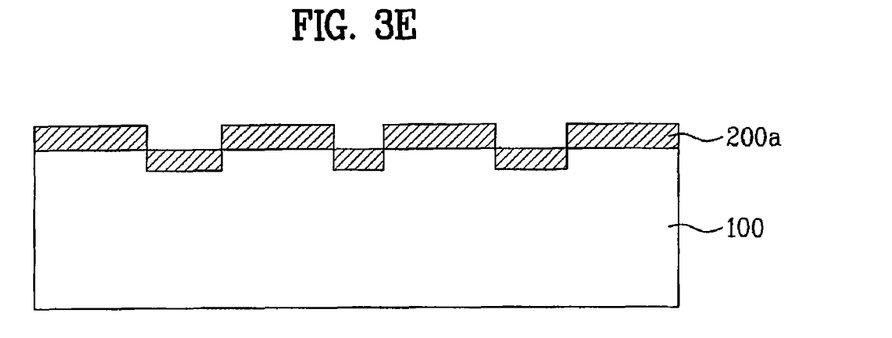

As shown in FIG. 3E, a second metal layer 200a is formed on the glass substrate 100.

Figure 3F:
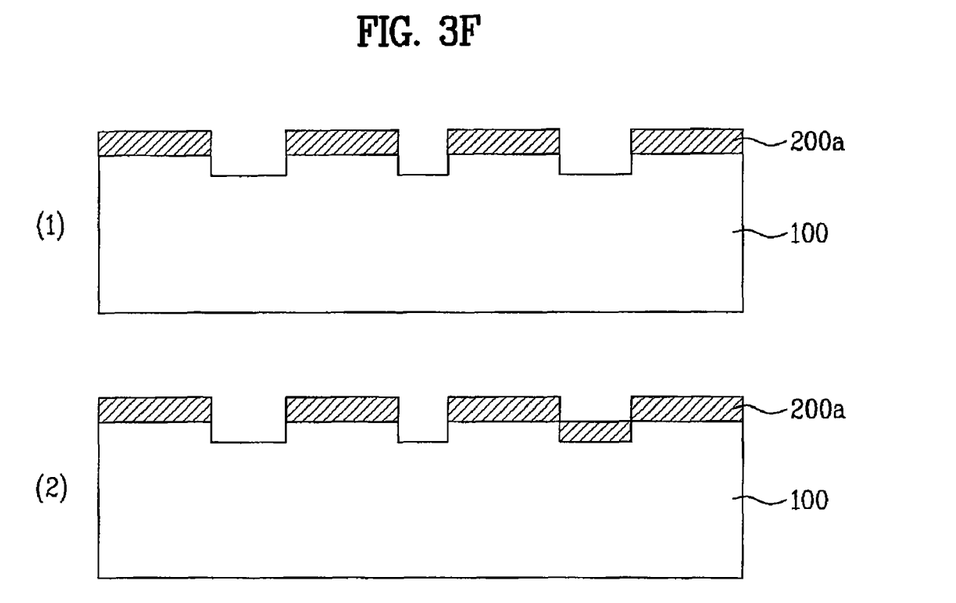

As shown in FIG. 3F, the second metal layer 200a is patterned. At this time, as shown in FIG. 3F(1), the pattern of the second metal layer 200a may be same as the pattern of FIG. 3B. In other words, the second metal layer 200a may be patterned such that the second metal layer 200a remains only on the second portions 204.

Alternatively, as shown in FIG. 3F(2), the pattern of the second metal layer 200a may be different from the pattern of FIG. 3B. As shown in FIG. 3F(2), the second metal layer 200a is patterned such that the second metal layer 200a remains on the second portions 204 and at least one of first portions 202a. Alternatively, the first portion 202a on which the second metal layer 200a is formed has a narrower width than that of the other first portions 202.

Preferably, the second metal layer 200a is patterned according to the process of FIGS. 4A to 4D.

Figure 3G:
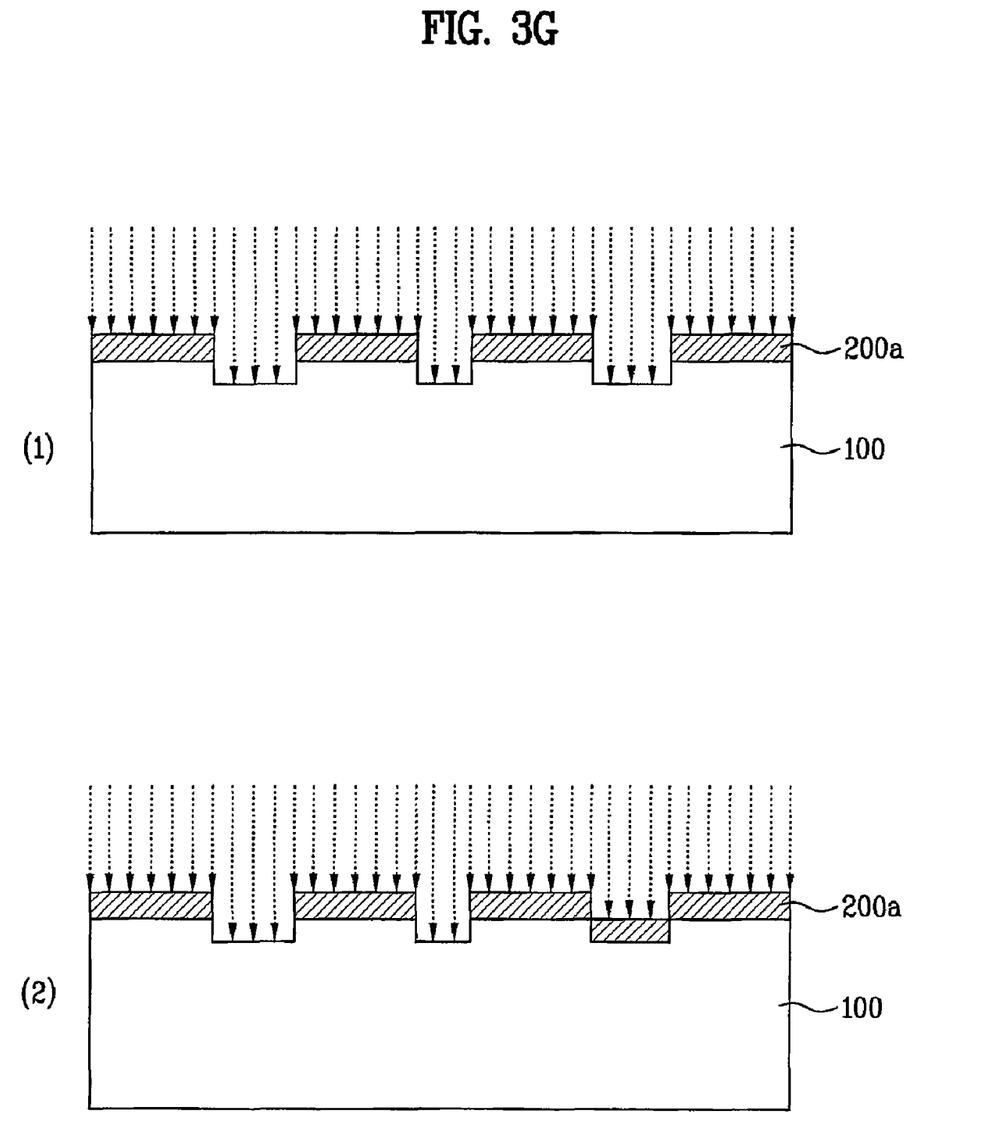

After that, as shown in FIG. 3G, the glass substrate 100 is etched using the second metal layer 200a as a mask. As shown above, the glass substrate 100 may be dry etched.

In the process for patterning the second metal layer 200a, if the pattern of the second metal layer 200a is the same as the pattern of FIG. 3B, the etching depth is uniform, as shown in FIG. 3G(1). Alternatively, if the pattern of the second metal layer 200a is different from the pattern of FIG. 3B, the etching depth is not uniform, as shown in FIG. 3G(2).

Figure 3H:
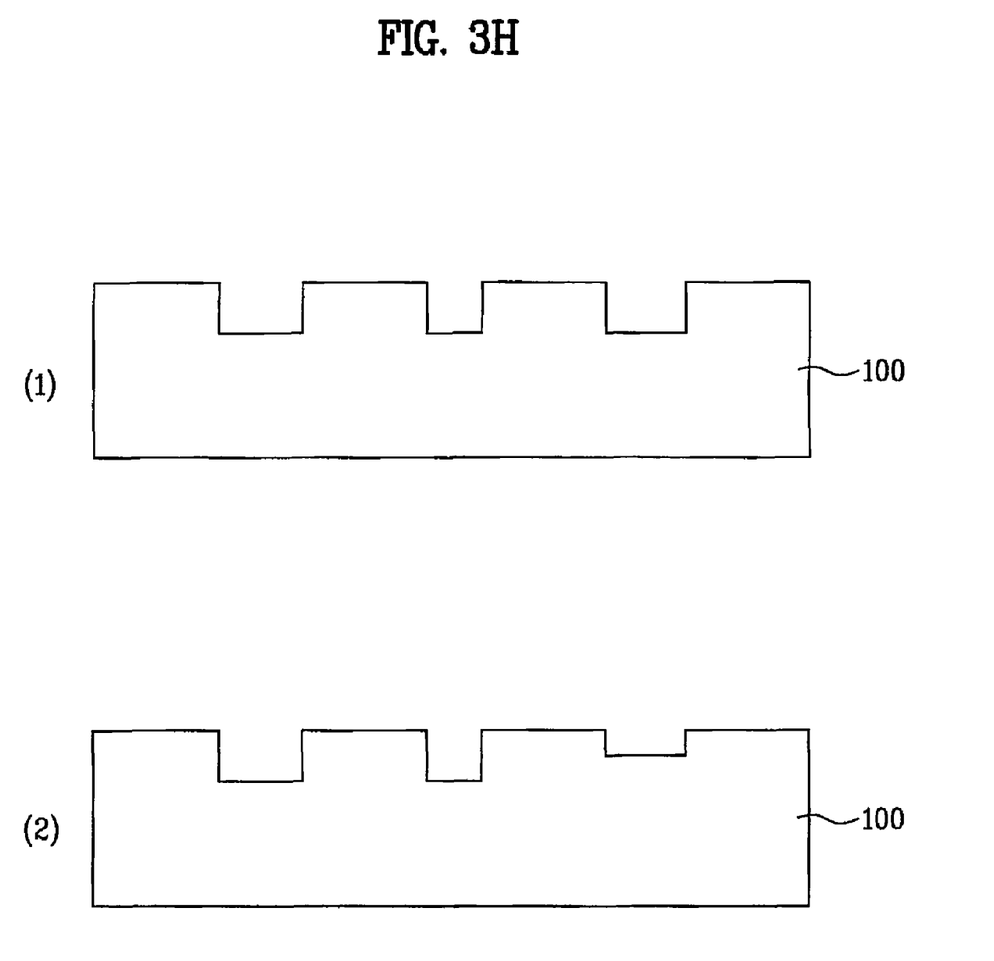

As shown in FIG. 3H, the patterned second metal layer 200a is then removed, thereby fabricating the printing plate having the glass substrate 100 of the second pattern. The result may be a glass substrate having grooves 110 with a uniform etching depth, as shown in FIG. 3H(1), or a glass substrate having grooves 120, 122 with a nonuniform etching depth, as shown in FIG. 3H(2).

The process for etching the glass substrate 100 using the second metal layer 200a as a mask is repetitively performed, making it possible to etch the glass substrate 100 to a desired depth. In the drawings, the aforementioned process is repeated once. However, if necessary, it is possible to repeat the aforementioned process several times. If the second metal layer 200a is thin, the number times the process is repeated increases. In this respect, it is preferable to form the thick metal layer. As described above, however, as the metal layer increases in thickness, the difficulty in patterning the metal layer also increases. Accordingly, it is preferable to form a metal layer having a thickness within the scope suitable for the patterning process.

The at least one of grooves having the narrower width than that of the other grooves has a shallower depth than that of the other grooves. On other words, at least one of grooves having a wider width than that of the other grooves has deeper depth than that of the other grooves.

In the printing method according to the present invention, instead of using the organic material for formation of the pattern, the process of patterning the pattern uses the glass substrate itself. It is thus possible to prevent inaccurate patterns from being formed.

In addition, if the metal layer is not thick enough to permit etching of the glass substrate to the desired depth, repetitive etching steps may be performed. Thus, even though the metal layer is etched, it is possible to etch the glass substrate to the desired depth.

If performing repetitive etching steps, it is possible to form various mask shapes by applying various patterning methods to the metal layer for the mask.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating at least one of a semiconductor device or an LCD device, the method comprising:
   providing a printing plate containing a first glass substrate with a plurality of grooves etched in a predetermined shape on the surface;
   printing a predetermined material on a surface of the printing plate by rolling a first printing roll along the surface of the printing plate;
   transferring the predetermined material in a desired pattern on the surface of the printing plate to a second printing roll by rolling the second printing roll along the surface of the printing plate; and
   printing the predetermined material in the desired pattern on a surface of a second substrate by rolling the second printing roll on the second substrate,
   wherein the providing the printing plate comprises:
   forming a first metal layer on the first glass substrate including a first region and a second region apart from the first region;
   patterning the first metal layer in a predetermined shape;
   dry etching the first glass substrate to a first depth using a patterned first metal layer as a first etch mask;
   removing the patterned first metal layer, thereby performing one cycle, wherein a number of repetitions of the one cycle depends on a thickness of the first metal layer and an etching depth of the first glass substrate;
   forming a second metal layer on the etched first glass substrate;
   patterning the second metal layer in the same area as the patterned first metal layer; and
   dry etching the etched first glass substrate to a second depth formed within the same region as the first depth using the patterned second metal layer as a second etch mask identical to the first etch mask,
   wherein the first and second metal layers are etched when the first glass substrate is etched, an etching rate of the first and the second metal layer is lower than the etching rate of the first glass substrate and the etching ratio of the first and the second metal layer to the first glass substrate is about 1:4 to about 1:10.

2. The method of claim 1, wherein the second substrate comprises a glass substrate.

3. The method of claim 1, wherein the first printing roll is entirely coated with the predetermined material prior to rolling the first printing roll along the surface of the printing plate.

4. The method of claim 1, wherein the second substrate is an LCD substrate.

5. The method of claim 1, wherein the second substrate is a semiconductor substrate.

6. A method of fabricating at least one of a semiconductor device or an LCD device, the method comprising:
   providing a printing plate containing a first substrate with a plurality of grooves etched in a predetermined shape on the surface, wherein at least one of grooves having a wider width than that of the other grooves has deeper depth than that of the other grooves;
   printing a predetermined material on a surface of the printing plate by rolling a first printing roll along the surface of the printing plate;
   transferring the predetermined material in a desired pattern on the surface of the printing plate to a second printing roll by rolling the second printing roll along the surface of the printing plate; and
   printing the predetermined material in the desired pattern on a surface of a second substrate by rolling the second printing roll on the second substrate,
   wherein the providing the printing plate comprises:
   forming a first metal layer on a glass substrate including a first region and a second region apart from the first region;
   patterning the first metal layer in a predetermined shape to expose the glass substrate of the first region and the second region;
   dry etching the glass substrate of the first region and the second region to a first depth using a patterned first metal layer as a first etch mask;
   removing the patterned first metal layer, thereby performing one cycle, wherein a number of repetitions of the one cycle depends on a thickness of the first metal layer and an etching depth of the glass substrate;

forming a second metal layer on the etched glass substrate;

patterning the second metal layer to expose the glass substrate of the first region excluding the second region;

dry etching the etched glass substrate of the first region excluding the second region to a second depth using a patterned second metal layer as a second etch mask;

wherein the first and second metal layers are etched when the glass substrate is etched, an etching rate of the first and the second metal layer is lower than the etching rate of the glass substrate and the etching ratio of the first and the second metal layer to the glass substrate is about 1:4 to about 1:10.

7. The method of claim 6, wherein the first depth of the second region is different from the second depth of the first region.

8. The method of claim 6, wherein the first printing roll is entirely coated with the predetermined material prior to rolling the first printing roll along the surface of the printing plate.

* * * * *